United States Patent

Church et al.

[11] Patent Number: 5,817,564
[45] Date of Patent: *Oct. 6, 1998

[54] DOUBLE DIFFUSED MOS DEVICE AND METHOD

[75] Inventors: Michael D. Church, Sebastian; Akira Ito, Palm Bay, both of Fla.

[73] Assignee: Harris Corporation, Melbourne, Fla.

[ * ] Notice: This patent issued on a continued prosecution application filed under 37 CFR 1.53(d), and is subject to the twenty year patent term provisions of 35 U.S.C. 154(a)(2).

[21] Appl. No.: 671,157

[22] Filed: Jun. 28, 1996

[51] Int. Cl.$^6$ .................................................. H01L 21/336
[52] U.S. Cl. ............................................ 438/307; 438/529
[58] Field of Search ................................ 257/335, 336, 257/344, 382, 384, 388, 408, 412; 438/529, 305, 307

[56] References Cited

U.S. PATENT DOCUMENTS

| | | |
|---|---|---|
| 4,035,198 | 7/1977 | Dennard et al. . |
| 4,342,149 | 8/1982 | Jacobs et al. ............................ 257/336 |
| 4,703,551 | 11/1987 | Szluk et al. . |
| 4,801,555 | 1/1989 | Holly et al. ............................. 438/529 |
| 4,907,048 | 3/1990 | Huang . |
| 4,963,504 | 10/1990 | Huang . |
| 4,975,385 | 12/1990 | Beinglass et al. . |
| 5,021,851 | 6/1991 | Haken et al. . |
| 5,024,960 | 6/1991 | Haken . |
| 5,091,763 | 2/1992 | Sanchez ................................... 257/344 |
| 5,102,815 | 4/1992 | Sanchez . |
| 5,177,571 | 1/1993 | Satoh et al. ............................. 257/336 |
| 5,198,995 | 3/1993 | Dennard et al. . |
| 5,308,780 | 5/1994 | Chou et al. . |
| 5,374,836 | 12/1994 | Vinal et al. ............................. 257/344 |
| 5,512,506 | 4/1996 | Chang et al. . |
| 5,565,369 | 10/1996 | Ko ........................................ 438/529 |

OTHER PUBLICATIONS

Lutze, J. et al., "Techniques for Reducing the Reverse Short Channel Effect in Sub–0.5 $\mu$m CMOS," *IEEE Electron Device Letters*, vol. 16, No. 9, Sep. 1995.

*Primary Examiner*—John Niebling
*Assistant Examiner*—Richard A. Booth
*Attorney, Agent, or Firm*—Jaeckle Fleischmann & Mugel, LLP

[57] ABSTRACT

The double lightly diffused transistor has drain regions with a lightly doped arsenic region 42 entirely contained within a lightly doped phosphorus region 40. The arsenic region is implanted with a dose less than $1\times10^{15}$ ions/cm$^2$ and is preferably implanted with a dose of about $3\times10^3$ to $2\times10^{14}$ ions/cm$^2$. The drains are silicided for ohmic contact.

6 Claims, 2 Drawing Sheets

DOUBLE DIFFUSED MOS DEVICE AND METHOD

BACKGROUND

A characteristic trend in semiconductor fabrication technology and MOS fabrication technology, in particular, is scaling devices to provide higher densities of packing and to improve performance. As the physical dimensions of devices are reduced below one micron, the devices experience undesirable effects, including the generation of hot electrons. Such hot electrons are released from drain regions adjacent to gate. They may be injected into the gate oxide and cause long term reliability problems. Hot electrons are high energy electrons that are generated in the channel region of a MOS device where electric fields are excessively high. In general, the higher the drain doping concentration, the higher the electric field for a given channel length and voltage. Of course, the problem may be solved by increasing the oxide thickness of the gate or the length of the channel. However, those solutions are not practical especially when it is desired to shrink the overall size of the device and increase performance. The gate oxide thickness and physical channel length are fundamental scaling factors in device design that are traded off against the adverse generation of hot electrons that degrade performance and reliability.

A common method for reducing the number of hot electrons provides for a shallow lightly doped drain region in addition to the normal deep and heavily doped drain region. The lightly doped drain is typically made from an implant of a species of ion that rapidly diffuses through the silicon substrate. The lightly doped drain is implanted into approximately the same region as the heavily doped drain. In a NMOS structure, the lightly doped drain is formed by an implant of phosphorus while the deeper and heavily doped drain is formed by a separately masked implant of arsenic. After the phosphorus implant and prior to the arsenic implant, spacers are formed on the side wall of gate regions to offset the slower arsenic ions from the faster phosphorus ions. The combination of different diffusion coefficients and the spacer width allow the phosphorus to reach the channel region while the arsenic generally does. not. This leads to a grading of the doping profile, smaller electric fields and improved hot electron immunity. The arsenic ions are commonly implanted in concentrations greater than $1\times10^{15}$ ions/cm$^2$. Such high concentrations are required for good ohmic contact to the silicon substrate.

Other transistors are formed using doubled diffused drains. With a double diffused drain, two regions of relatively deep vertical diffusions are formed. Again, one region is formed with an arsenic implant and the other, lesser doped region is formed with a phosphorus implant. Such double diffused regions have the desired result that the more heavily doped arsenic region is entirely contained within the diffusion of the more lightly doped phosphorus region. However, such doubled diffused devices have the undesired result of relatively deep vertical and lateral dimensions. Such deep vertical diffusions are unacceptable in submicron MOS devices because the source and drain lateral side diffusion under the gate decreases the effective channel length to the point where the transistor can not support the operating voltage (i.e. the transistor breakdown [drain to source] is less than the supply voltage). The deeper junctions also lead to increased the drain to body and gate to drain capacitance.

Examples of methods and devices using double diffused implants with light and heavy dopings are found in U.S. Pat. Nos. 5,308,780; 5,102,815; 4,975,385; and 4,703,551. Each uses an arsenic implant as the heavier implant and in each case the heavier arsenic implant is in excess of $1\times10^{15}$ atoms/cm$^2$. The heavier arsenic diffusion results in source and drain regions with relatively deep diffusions. Such devices and processes are not scalable to smaller geometries. As the gate length decreases, the source and drain regions move too close together and limit the operating voltage of the transistor. Also, this increases the gate to drain capacitance of the prior art devices.

Accordingly, there is an unmet need for a suitable source and drain architecture that provides acceptable ohmic contact to the metal/silicon interface and yet contains a shallow, heavily doped region entirely within a more lightly doped shallow drain region which is also scalable to the submicron regime.

SUMMARY

The invention provides a method and a MOS structure that achieves the unmet needs of the prior art. With the invention, a phosphorus ion implant is used to form a shallow, lightly doped drain region that extends toward the gate. An arsenic implant dose forms a drain region that is shallower than the lightly doped region so that the arsenic diffusion remains entirely within the more lightly doped phosphorus diffusion. The arsenic implant has a dose of less than $1\times10^{15}$ ions/cm$^2$ and is preferably implanted in the range of about $3\times10^{13}$–$2\times10^{14}$ ions/cm$^2$. So, the arsenic implant is substantially less than the arsenic implants found in prior art light doped drains and prior art double diffused drains. Phosphorus is implanted in concentrations typical of lightly doped drains, i.e. $5\times10^{12}$–$1\times10^{14}$ ions/cm$^2$. In performing the ion implants of the invention, the scalability problems of the double diffused drain structures of the prior art are overcome. Oxide, nitride, or polysilicon spacers commonly used with lightly doped drain structures are optional, but not required in this invention. Instead, both implants are made through an oxide layer that covers the polysilicon gate. After completing the implants, the oxide layer is anisotopically etched to expose the gate polysilicon and remove the oxide spacer from the surface of the silicon. In a final step, the device is silicided so that the source and drain in the polysilicon gate are highly conductive and good ohmic contact is established with any metal deposited there on.

DETAILED DESCRIPTION

Figure 1A:
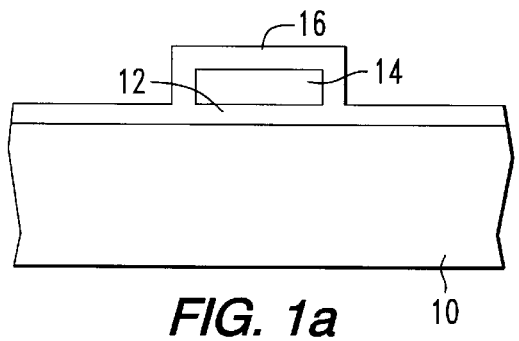
FIGS. 1a–1c show typical steps in forming an FET using a prior art double diffused process.
Figure 2A:
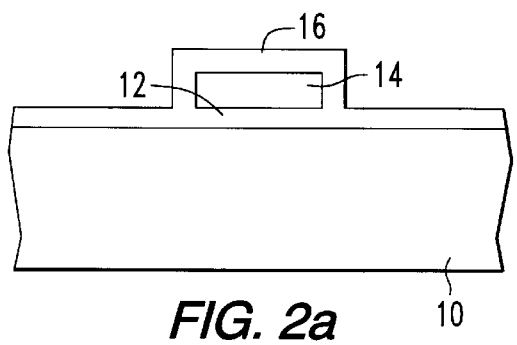
FIGS. 2a–2d show typical steps in forming an FET using a prior art lightly doped drain process.
Figure 1B:
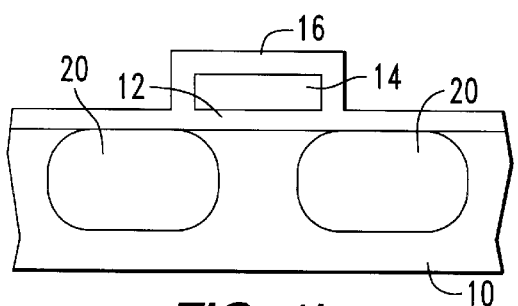
Figure 1C:
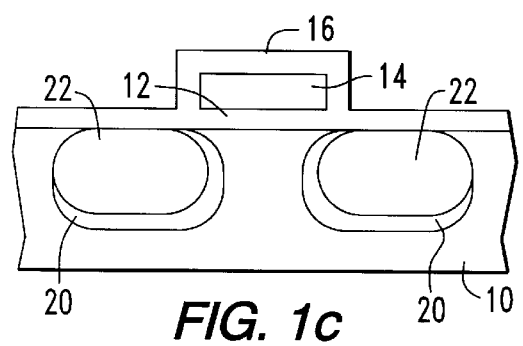

A prior art double diffused process is schematically illustrated in FIGS. 1a–1c. A conventional lightly doped drain process is shown in FIGS. 2a–2d. The invent to process and the invent of transistor is shown in FIGS. 3a–3e. Like reference numerals in the respect to figures refer to like elements.

Turning to FIGS. 1a–1c, there is shown a semiconductor substrate 10, typically comprising monocrystalline silicon. The semiconductor substrate 10 may include one or more epitaxial layers (not shown) and may include one or more P-wells if the substrate is N-type material. A gate oxide layer 12 is thermally grown on the surface of substrate 10. A layer of polysilicon 14 is deposited on the gate oxide 12 and patterned to form the gate 14. Then the gate 14 is covered with a thermally grown oxide layer 16. Next, a first implant of phosphorus 20 is made directly into the substrate 10 through the thermal oxide layer 16. The implant 20 is a lightly doped implant in the range of $5\times10^{12}$–$1\times10^{14}$ ions/cm$^2$, in particular, with ions of phosphorus. The implant is made at an implant energy of approximately 100 KeV. In the following step shown in FIG. 1c, a heavier doped drain implant of arsenic 22 is made at an implant dose of at least $2\times10^{15}$–$1\times10^{16}$ ions/cm$^2$. Both of the implants are subsequently diffused under a thermal treatment to the relative size as shown in FIG. 1b, 1c. As such, the diffusion of the double diffused process extend relatively deeply into the substrate 10. Also, the diffusions extend laterally beneath the gate. The lateral extensions of the diffusions reduces the effective gate length. As such, a conventional double diffused process of the prior art is unsuitable for devices where the physical gate length is less than 1.2 microns.

Figure 2B:
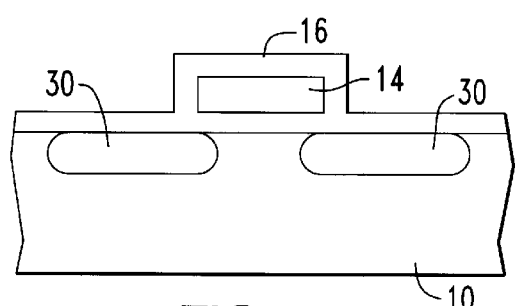
Figure 2C:
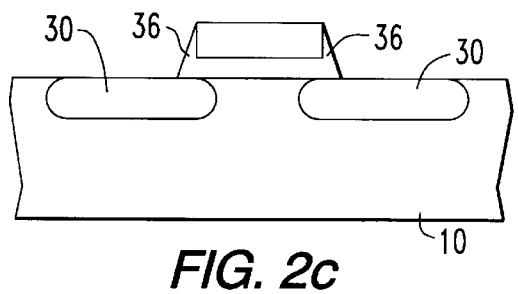
Figure 2D:
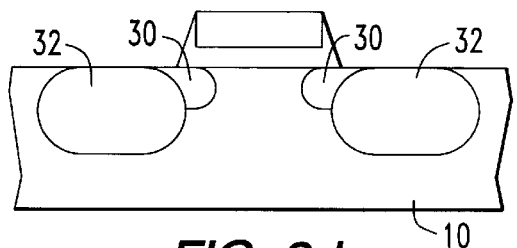

A conventional lightly doped drain process is illustrated in FIGS. 2a–2d. There, a lightly doped drain implant is shown in FIG. 2b. The implant 30 is a phosphorus implant in a range of about $5\times10^{12}$–$1\times10^{14}$ ions/cm$^2$ phosphorus at an implant energy of 40–100 KeV. It is well known in the art that when the implant 30 is subsequently diffused into the substrate 10, it forms a relatively shallow region. The implant 30 extends to just about the edges of the gate but does not unduly encroach upon the gate region. In the following steps, a spacer material, generally oxide, is deposited and anisotropically etched leaving sidewall spacers 36 on opposite sides of the gate 14. Then arsenic is implanted in the range of $2\times10^{15}$–$1\times10^{16}$ ions/cm$^2$. The arsenic ions are diffused to form the heavily doped drain region 32. It will be appreciated that the heavily doped drain region 32 shown in FIG. 2d is essentially the same size as the heavily doped drain region 22 of the conventional double diffused drain shown in FIG. 1c. In both cases, the heavily doped drain diffusion extends deeply into the substrate 10. The heavy concentration of ions required for ohmic contact and the depth of the diffusion increases the drain to body capacitance of the conventional lightly doped drain transistor. Also, this heavy implant has been theorized to be responsible for reverse short channel effects (RSCE) observed in submicron CMOS. See, for example, Lutze et al., IEEE Electron Device Letters, Sept. 1995, Vol. 16, No. 9, pp. 373–375.

Figure 3A:
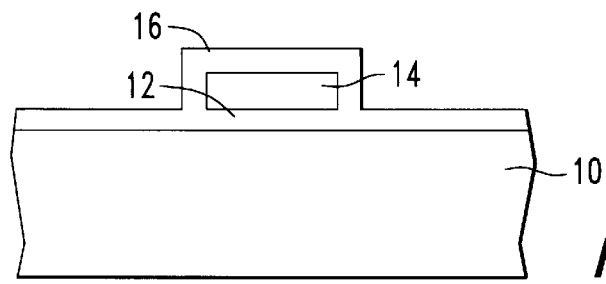
FIGS. 3a–3e show typical steps in forming an FET using the invention.
Figure 3B:
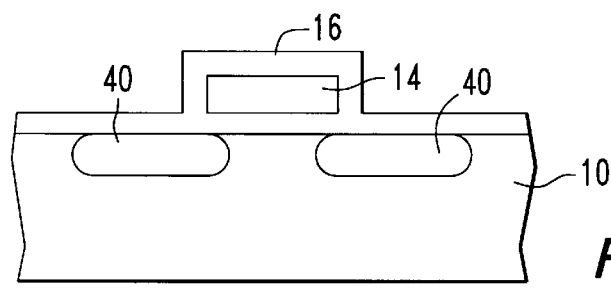
Figure 3C:
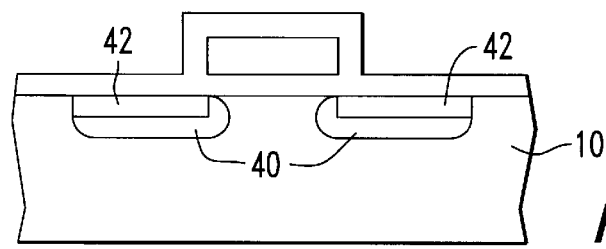
Figure 3D:
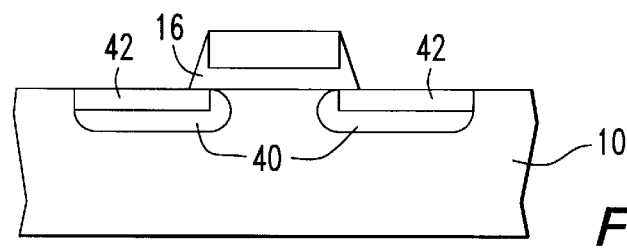
Figure 3E:
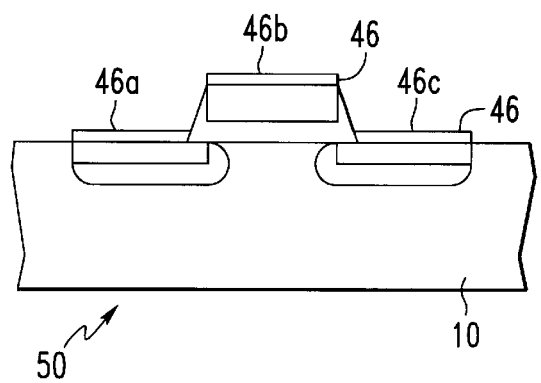

Turning to FIGS. 3a–3e, there is shown a substrate 10 with a gate oxide 12, a gate 14 and a thermal oxide layer 16 grown over the gate 14 and over the substrate 10. A first implant 40 of phosphorus is made. The phosphorus implant 40 is made in a range of $5\times10^{12}$–$1\times10^{14}$ ions/cm$^2$ at an implant energy of 40–80 KeV. The dose of implant 40 is essentially of the same order as the lightly doped drain implant 30 of the conventional lightly doped drain process. As shown in FIG. 3c, a second lightly doped drain implant 42 of arsenic is implanted at concentrations of $3\times10^{13}$–$2\times10^{14}$ ions/cm$^2$ at implant energies of 40–120 KeV. The first slightly doped region of phosphorous has a P concentration of $5\times10^{17}$ to $8\times10^{18}$/cm$^3$ and the second, heavier doped region of arsenic has a P concentration of $5\times10^{18}$ to $3\times10^{19}$/cm$^3$. The implants 40 and 42 are diffused to achieve the final relative sizes shown in FIG. 3c. There, the more heavily doped arsenic implant 42 is entirely contained within the lightly doped drain implant 40. The dielectric layer 16 sufficiently offsets the second implant 42 so that it does not unduly encroach upon the region beneath the gate 14. The depth of the region 42 is approximately 0.1 microns and the depth of region 40 is approximately 0.2 microns. In a following step, the oxide layer 16 is removed by an anisotropic etch to leave sidewall spacers 36 on opposite sides of the gate 14. Optionally, an additional spacer deposition may proceed the etch to provide for a thicker sidewall spacer 36. Then the substrate 10 is subjected to a silicide process to create silicide regions 46a, 46b, 46c on the respective surfaces of the source, gate, and drain. The completed transistor 50 is shown in FIG. 3e.

It is a feature of the invention that the arsenic implant dose 42 is small enough such that it remains entirely within the lightly doped phosphorus drain implant 40. Also, no RSCE are observed when using this technique. Containing of the arsenic implant within the phosphorus doped region appears similar to the conventional double doped drain process of FIG. 1a–1c. However, the inventive method overcomes the scalability problems associated with the double diffused drain structure. The conventional double diffused drain structure is not scalable because the heavy arsenic implant 22 encroaches upon the channel beneath the gate and reduces the effect length of the gate. In contrast, the lighter doped arsenic implant 42 of the invention does not encroach upon the channel and does not extend deeply into the substrate. While the lightly doped drain structure does not have the same scalability problems as the double diffused drain, it does require an additional mask over the invention. Also, the source and drain series resistances of the lightly doped drain structure are larger than that of the invention due to the additional resistance under the spacer. This is because the arsenic diffusion is present under the spacer in the invention which is not true in the lightly doped drain architecture.

In contrast, the source and drain structures of the invention are relatively shallow and the outer boundaries of the drain structures are established by the lightly doped drain implant 40. Since the arsenic implant 42 is of a relatively lighter doping compared to implants 22 and 32 of the prior art, the devices formed with the inventive method have improved performance. In particular, the drain to body and drain to gate capacitances of transistor 50 is significantly reduced since the arsenic implant 42 neither extends deeply into the substrate nor does it encroach upon the channel under the gate. And, the RSCE has been eliminated which eases transistor modeling and circuit design. Ohmic contact relies upon using a silicide to establish contacts 46a–46c which yield comparable contact resistance similar to the ohmic contact established by the heavily doped regions 22 and 32 of the prior art.

Having thus disclosed the preferred embodiment of the invention, it is believed that those skilled in the art will appreciate that further improvements, additions, changes and alterations made thereto without departing from the spirit and scope of the invention is set forth in the following claims.

We claim:

1. A process for forming source and drain regions in a field effect transistor comprising the steps of:
   thermally growing a gate oxide on a semiconductor substrate;
   forming a gate on said gate oxide;
   covering the gate and the substrate with a dielectric layer;
   forming an implant mask using the dielectric layer over the substrate;
   using said implant mask for implanting the substrate with a first ion implant dose of phosphorous implanted in a range of dosage of $5\times10^{12}$–$1\times10^{14}$ions/cm$^2$;

using the same implant mask with no additional masking layers for implanting the substrate with a second ion implant dose of arsenic implanted in a range of less than $1\times10^{15}$ ions/cm$^2$ to thereby form implanted source and drain regions self aligned with the gate, wherein the second implant does not diffuse beyond the region of the first implant; and removing said implant mask.

2. The process of claim 1 wherein the second implant is in the range of about $3\times10^{13}$ to $2\times10^{14}$ ions/cm$^2$.

3. The process of claim 1 comprising the further steps of removing the dielectric from over the gate and from over the substrate and siliciding the gate and the substrate.

4. The process of claim 1 wherein the two implants are performed before removing the dielectric layer in order to self align the implants to the gate.

5. The process of claim 4 wherein the second implant is performed immediately following the first implant.

6. The process of claim 1 wherein the implants are diffused by heating the substrate.

* * * * *